(12) United States Patent
Kim et al.

(10) Patent No.: US 11,361,941 B2
(45) Date of Patent: Jun. 14, 2022

(54) METHODS AND APPARATUS FOR PROCESSING A SUBSTRATE

(71) Applicant: APPLIED MATERIALS, INC., Santa Clara, CA (US)

(72) Inventors: Junghoon Kim, Santa Clara, CA (US); Tae Seung Cho, San Jose, CA (US); Dmitry Lubomirsky, Cupertino, CA (US); Toan Tran, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 221 days.

(21) Appl. No.: 16/906,875

(22) Filed: Jun. 19, 2020

(65) Prior Publication Data
US 2021/0398778 A1    Dec. 23, 2021

(51) Int. Cl.
*H01J 37/32*    (2006.01)

(52) U.S. Cl.
CPC .... *H01J 37/32174* (2013.01); *H01J 37/3255* (2013.01); *H01J 37/32091* (2013.01)

(58) Field of Classification Search
CPC ........... H01J 37/32174; H01J 37/32091; H01J 37/3255; H01J 37/32082; H01J 37/32183
See application file for complete search history.

(56) References Cited

U.S. PATENT DOCUMENTS

| | | |
|---|---|---|
| 5,479,340 A | 12/1995 | Fox et al. |
| 5,737,177 A | 4/1998 | Mett et al. |
| 5,770,922 A | 6/1998 | Gerrish et al. |
| 5,808,415 A | 9/1998 | Hopkins |
| 5,867,020 A | 2/1999 | Moore et al. |
| 6,239,587 B1 | 5/2001 | Buck |
| 6,449,568 B1 | 9/2002 | Gerrish |
| 6,708,123 B2 | 3/2004 | Gerrish |
| 10,128,090 B2 | 11/2018 | Valcore, Jr. et al. |
| 2008/0277062 A1 | 11/2008 | Koshimizu et al. |
| 2010/0136793 A1* | 6/2010 | Chen ............... H01J 37/32082 156/345.28 |
| 2015/0091441 A1* | 4/2015 | Marakhtanov .... H01J 37/32174 315/111.21 |

(Continued)

FOREIGN PATENT DOCUMENTS

KR    20100106088    10/2010

OTHER PUBLICATIONS

International Search Report for PCT/US2021/018699, dated Jun. 10, 2021.

*Primary Examiner* — Renan Luque
(74) *Attorney, Agent, or Firm* — Moser Taboada

(57) ABSTRACT

Methods and apparatus for processing a substrate are herein described. For example, a processing chamber for processing a substrate includes a chamber body defining a processing volume; a radio frequency (RF) power source configured to deliver RF energy to the processing volume for processing a substrate; a substrate support comprising an electrode; an AC power supply configured to supply power to the processing chamber; an RF filter circuit connected between the electrode and the AC power supply; and a controller configured to monitor an RF voltage at the RF filter circuit that is indirectly induced into the electrode by the RF power source during operation, and to determine a processing state in the processing volume based on the monitored RF voltage.

17 Claims, 3 Drawing Sheets

(56) References Cited

U.S. PATENT DOCUMENTS

| | | | |
|---|---|---|---|
| 2016/0113103 A1* | 4/2016 | Van Zyl | H01J 37/32155 |
| | | | 315/111.21 |
| 2020/0090907 A1 | 3/2020 | Kim et al. | |
| 2020/0152423 A1 | 5/2020 | Nguyen et al. | |

* cited by examiner

METHODS AND APPARATUS FOR PROCESSING A SUBSTRATE

FIELD

Embodiments of the present disclosure generally relate to a methods and apparatus for processing a substrate, and more particularly, to methods and apparatus configured to monitor a state of plasma used during substrate processing.

BACKGROUND

Plasma processing chambers for processing a substrate are known, but substrate processing with plasma is becoming more and more challenging, such as when substrate critical features are below 30 nm. Accordingly, monitoring and/or diagnosing a state of a plasma, for example, near an electrostatic chuck (ESC)/pedestal area within the plasma processing chamber during substrate processing is a critical requirement. Conventional methods and apparatus monitor the plasma using voltage or current measurements provided by corresponding voltage and current sensors at an output of an impedance matching network of the plasma processing chamber. Although such an approach can be easily implemented, there exists a potential loss of information due to the propagation of RF waves through a transmission line that connects the impedance matching circuit to an RF electrode in the ESC/pedestal.

SUMMARY

Methods and apparatus for processing a substrate are provided herein. In some embodiments, an apparatus for processing a substrate includes a chamber body defining a processing volume; a radio frequency (RF) power source configured to deliver RF energy to the processing volume for processing a substrate; a substrate support comprising an electrode; an AC power supply configured to supply power to the processing chamber; an RF filter circuit connected between the electrode and the AC power supply; and a controller configured to monitor an RF voltage at the RF filter circuit that is indirectly induced into the electrode by the RF power source during operation, and to determine a processing state in the processing volume based on the monitored RF voltage.

In accordance with at least some embodiments, a method of monitoring a processing condition in a processing volume of a processing chamber includes supplying radio frequency (RF) power from a RF power source to the processing volume for processing a substrate; monitoring an RF voltage at an RF filter circuit indirectly induced into an electrode by the RF power source; and determining a processing state in the processing volume based on the RF voltage.

In accordance with at least some embodiments, a non-transitory computer readable storage medium having stored thereon instructions that when executed by a processor perform a method of monitoring a processing condition in a processing volume of a processing chamber. The method includes supplying radio frequency (RF) power from a RF power source to the processing volume for processing a substrate; monitoring an RF voltage at an RF filter circuit indirectly induced into an electrode by the RF power source; and determining a processing state in the processing volume based on the RF voltage.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
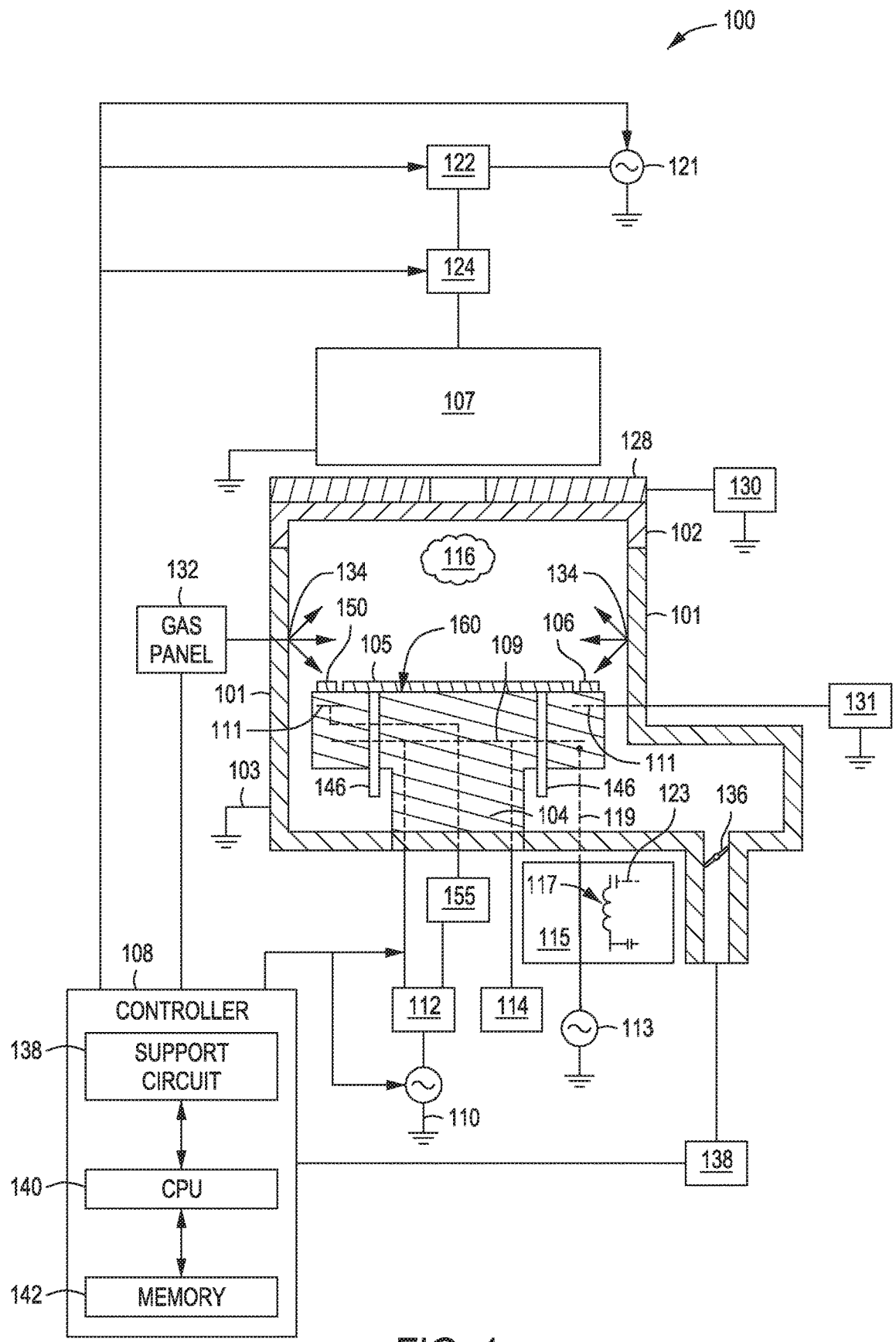
FIG. 1 is a cross-sectional schematic view of a processing chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for processing a substrate are provided herein. For example, the methods and apparatus described herein use a low pass RF filter including a pair of RF capacitive coupling ports configured to receive an RF voltage induced from an RF electrode coupled to a substrate support and used to heat a substrate. In at least some embodiments, an amount of RF voltage induced from the RF electrode, an RF waveform associated with the RF voltage induced from the RF electrode, or other information relating to the induced RF voltage is used to monitor a state of a plasma within a processing volume. Unlike conventional methods and apparatus that use voltage and/or current sensors, which can be expensive and difficult to install, the methods and apparatus described herein use the RF voltage induced into the pair of RF capacitive coupling ports, which are inexpensive and easy to install. Additionally, as the pair of RF capacitive coupling ports are located adjacent the RF electrode, as opposed to an output of an impedance matching network, the potential loss of information due to the propagation of RF waves through the transmission line that connects the impedance matching network to the RF electrode is reduced, if not eliminated. In view thereof, the methods and apparatus described herein provide a more accurate understanding of a state of a plasma during operation when compared to conventional methods and apparatus.

FIG. 1 is a schematic sectional view of a processing chamber 100, according to one example of the disclosure. The processing chamber 100 includes a chamber body 101 and a lid 102 disposed thereon that together define an inner volume. The chamber body 101 is typically coupled to an electrical ground 103.

The processing chamber 100 can be one of an inductively coupled plasma (ICP) chamber, and/or a capacitively coupled plasma (CCP) chamber. For example, in at least some embodiments, the processing chamber 100 is a chamber including a CCP apparatus 107 on top. In at least some embodiments, the top of the processing chamber 100 can be grounded. The CCP apparatus 107 generates a plasma of reactive species within the processing chamber 100, and a controller 108 (e.g., a system controller) is adapted to control systems and subsystems of the processing chamber 100, as described in greater detail below.

The CCP apparatus 107 is disposed above the lid 102 and is configured to capacitively couple RF power into the processing chamber 100 to generate a plasma 116 within the processing chamber 100. The CCP apparatus 107 can be adjusted as desired to control the profile or density of the plasma 116 being formed. The CCP apparatus 107 is coupled to an RF power supply 121 through a matching network 122 via an RF feed structure 124. The RF power supply 121 may illustratively be capable of producing up to about 60,000 W (but not limited to about 60,000 W) at a tunable frequency in a range from 50 kHz to 150 MHz, although other frequencies and powers may be utilized as desired for particular applications.

In some examples, a power divider (not shown), such as a dividing capacitor, may be provided between the RF feed structure 124 and the RF power supply 121 to control the relative quantity of RF power provided. For example, in embodiments when processing chamber 100 includes an ICP apparatus, the power divider may be used. In such embodiments, the power divider may be incorporated into the matching network 122.

A heater element 128 may be disposed on the lid 102 to facilitate heating the interior of the processing chamber 100. The heater element 128 may be disposed between the lid 102 and a plasma apparatus, such as the CCP apparatus 107. In some examples, the heater element 128 may include a resistive heating element and may be coupled to a power supply 130, such as an AC power supply, configured to provide sufficient energy to control the temperature of the heater element 128 within a desired range, as described in greater detail below.

A substrate support assembly 104 is disposed within the inner volume to support a substrate 105 thereon during processing (use). An edge ring 106 is positioned around a periphery of the substrate 105 on the substrate support assembly 104. The edge ring 106 is disposed on and surrounds a substrate support surface of an ESC.

The substrate support assembly 104 includes one or more electrodes, such as a first electrode 109 and a second electrode, such as a ring electrode 111 surrounding the first electrode 109. The first electrode 109 is coupled to a chucking power source 114 to facilitate chucking of the substrate 105 to the upper surface 160 during processing.

An AC power supply 113 is configured to supply power to the processing chamber 100 for energizing one or more components associated therewith. Unlike RF power sources, which operate at much higher frequencies (e.g., 13.56 MHz) and require matching circuits for impedance matching, the AC power supply 113 operates at much lower frequencies and don't require such matching circuits. For example, the AC power supply 113 can be configured, for example, to supply 110 v or 220 v at one or more suitable frequencies. For example, in at least some embodiments, the AC power supply 113 can be configured to supply up to 220 v at 50 Hz or 60 Hz and around 40 amps to the processing chamber 100.

In at least some embodiments, a DC power source 131 can be connected to the substrate support assembly 104 (e.g., to the ring electrode 111) and configured to provide a clamping force to clamp the edge ring 106 to the substrate support (e.g., to a ceramic ring 250 disposed on the substrate support as described below), e.g., to improve thermal control of the edge ring 106, during operation.

The first electrode 109 and the ring electrode 111 are each coupled to the RF power source 110 providing one or more frequencies through a matching network 112 (similar to the matching network 122) and the edge tuning circuit 155 (e.g., hereinafter simply referred to as an edge tuning circuit 155) including variable capacitors and inductors. The matching network 112 ensures that the output of the RF power source 110 is effectively coupled to the plasma to maximize the energy coupled to the plasma. The matching network 112 typically matches 50 ohms to the complex impedance of the plasma. To facilitate dynamic matching as the plasma characteristics change during processing, the matching network 112 can be adjusted as needed to ensure that a match is maintained throughout the process. The matching network 122 is configured and operates similarly with respect to the RF energy provided by the RF power source 121.

The edge tuning circuit 155 is an RF circuit that operates near resonance which enables adjusting a voltage higher or/and lower than a source voltage. The RF power source 110 is utilized to bias the substrate 105 disposed on an upper surface 160 of the substrate support assembly 104. The RF power source 110 may illustratively be a source of up to about 10,000 W (but not limited to about 10,000 W) of RF energy, which may be provided at one or multiple frequencies, such as 400 kHz, 2 MHz, 13.56 MHz, 27 MHz, 40 MHz, or 60 MHz. The RF power source 110 can include two or more independent RF power sources that are configured to provide RF energy at two or more corresponding frequencies. For example, in at least some embodiments, the RF power source 110 can include a first RF power source and a second RF power source each configured to provide RF energy at a corresponding frequency, e.g., 400 kHz and 2 MHz, and an optional third RF power source can be provided and can be configured to provide RF energy at a frequency of 400 kHz, 2 MHz, and/or 40 MHz. The RF power source 110 may be capable of producing either or both of continuous or pulsed power.

During operation, the substrate 105, such as a semiconductor wafer or other substrate suitable for plasma processing, is placed on the substrate support assembly 104. Substrate lift pins 146 are movably disposed in the substrate support assembly 104 to assist in transfer of the substrate 105 onto the substrate support assembly 104. After positioning of the substrate 105, process gases are supplied from a gas panel 132 through entry ports 134 into the inner volume of the chamber body 101. The process gases are ignited into a plasma 116 in the processing chamber 100 by applying power from the RF power supply 121 to the CCP apparatus 107. In some examples, power from the RF power source 110 may also be provided through the matching network 112 to the first electrode 109 and/or the edge ring 106 within the substrate support assembly 104. Alternatively or additionally, power from the RF power source 110 may also be provided through the matching network 112 to a baseplate and/or other electrode within the substrate support assembly 104.

The pressure within the interior of the processing chamber 100 may be controlled using a valve 136 and a vacuum pump 138. The temperature of the chamber body 101 may be controlled using fluid-containing conduits (not shown) that run through the chamber body 101.

The processing chamber 100 includes the controller 108 to control the operation of the processing chamber 100 during processing. The controller 108 comprises a central processing unit (CPU) 140, a memory 142 (e.g., non-transitory computer readable storage medium), and support circuits 144 for the CPU 140 and facilitates control of the components of the processing chamber 100. The controller 108 may be one of any form of general-purpose computer processor that can be used in an industrial setting for controlling various chambers and sub-processors. The memory 142 stores software (source or object code) that may be executed or invoked to control the operation of the processing chamber 100 in the manner described herein. For example, during processing, the software of the memory 142 comprises the instructions for manipulating various RF circuits provided herein to monitor an RF voltage indirectly induced by the RF power source 110 at an input of an RF filter circuit and determine a processing state in the processing volume based on the RF voltage, as described in greater detail below.

An RF filter circuit 115 (e.g., a low pass filter) is connected between an electrode (e.g., a heater) and the AC power supply 113. The RF filter circuit 115 includes one or more electrical elements including, but not limited to, resistors, inductors, capacitors, and the like. For example, in at least some embodiments, the RF filter circuit 115 includes a combination inductor and capacitor 117 connected in series (e.g., a shunt capacitor) that are configured as a low pass frequency filter on an AC power supply transmission line 119, e.g., to block one or more of the frequencies that the RF power source 110 is configured to operate at. For example, some of the frequencies that can be blocked by the low pass frequency filter can include, but are not limited to, 400 kHz or greater, 2 MHz or greater, 13.56 MHz or greater, 27 MHz or greater, 40 MHz or greater, or 60 MHz or greater, or the like. The RF filter circuit 115 also includes one or more capacitive coupling ports that are capacitively coupled to the AC power supply transmission line 119. For example, in at least some embodiments, the RF filter circuit 115 includes a capacitive coupling port 123. The capacitive coupling port 123 can have any suitable capacitive coupling power. For example, in at least some embodiments, the capacitive coupling port 123 can have a capacitive coupling power of about −40 dB to about −47 dB.

Figure 2:
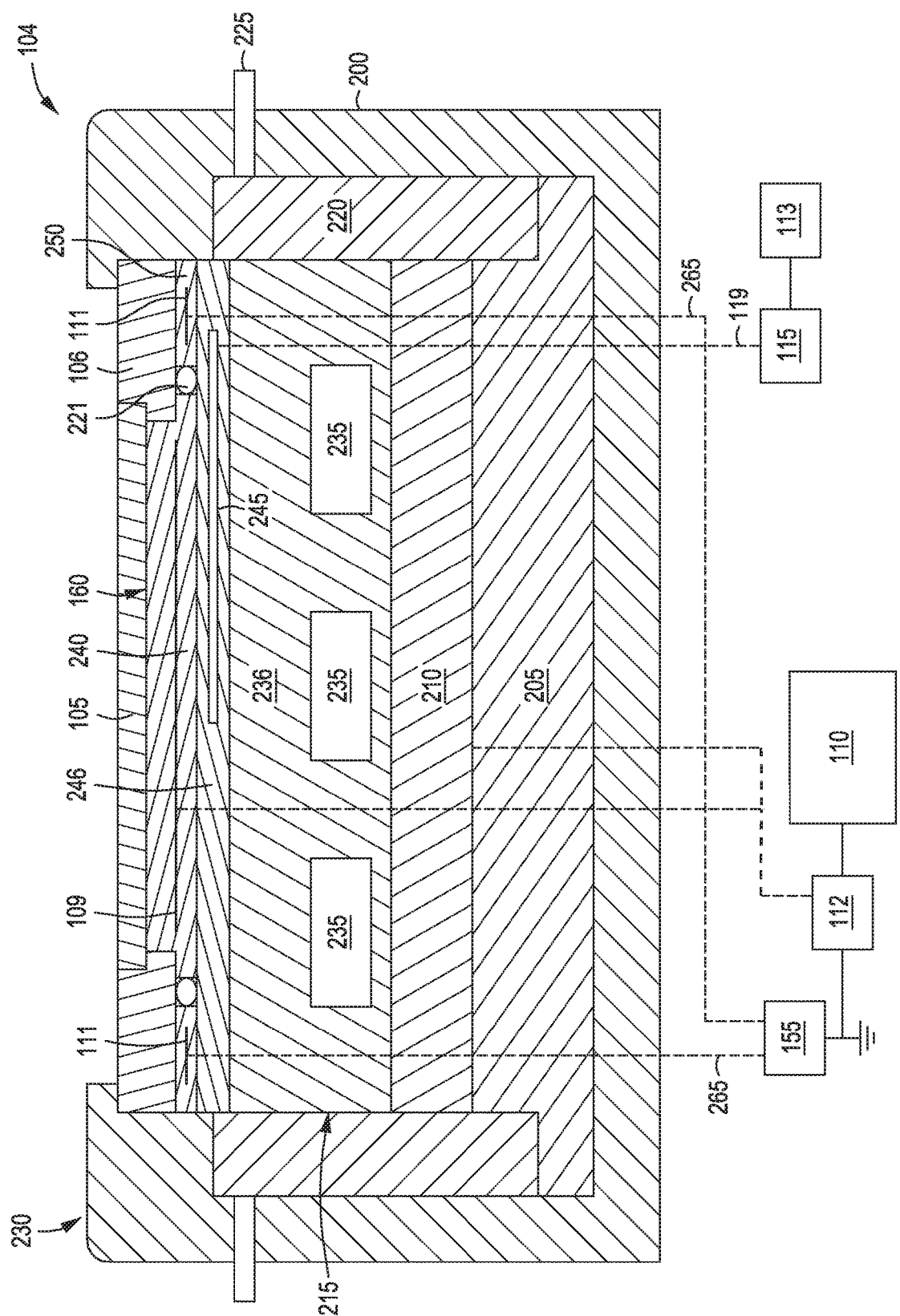
FIG. 2 is a cross-sectional schematic view of a substrate support of the processing chamber of FIG. 1 in accordance with at least some embodiments of the present disclosure.

FIG. 2 illustrates enlarged schematic side views of portions of the substrate support assembly 104 shown in FIG. 1, according to at least some embodiments of the disclosure. The substrate support assembly 104 includes a ground plate 200 surrounding an insulating layer 205, an electrode 210 (e.g., an RF electrode configured as a facilities or base plate), and an electrostatic chuck 215 assembled in a vertical stack.

The electrostatic chuck 215 includes one or more chucking electrodes (e.g., the first electrode 109) embedded therein for chucking the substrate 105 to a support surface of the electrostatic chuck 215. A quartz pipe ring 220 circumscribes the electrode 210 and the electrostatic chuck 215 to insulate the electrostatic chuck 215 from the ground plate 200. A plasma shield 225 is disposed on an upper surface of the quartz pipe ring 220 to facilitate plasma containment in the processing chamber 100 (shown in FIG. 1). A quartz ring 230 is positioned on an upper surface of the plasma shield 225.

The electrostatic chuck 215 includes one or more channels 235 formed in a first material 236 through which a fluid is provided to facilitate temperature control of the substrate support assembly 104. The first material 236 is a metallic material, such as aluminum. The electrostatic chuck 215 includes the first electrode 109 embedded in a second material 240. The second material 240 is a dielectric material, such as a ceramic material, such as alumina or aluminum nitride.

The electrode 210 can be made of a conductive material, such as aluminum, or other suitable conductive material, and is positioned between a lower portion of the ground plate 200 and the electrostatic chuck 215. The electrode 210 is coupled to the RF power source 110 and is configured to heat the substrate 105 using RF energy. The electrode 210 can also be configured to route fluid and/or gas from an input location (e.g., at a bottom thereof, not shown) to an output location (e.g., at a top thereof, not shown).

An electrode 245 surrounded by or embedded in a ceramic layer 246 (e.g., alumina or aluminum nitride) is disposed adjacent to or in the electrostatic chuck 215 to facilitate temperature control of the substrate 105. The electrode 245 may be, for example, a resistive heater having a plurality of resistive heating elements embedded therein. The electrode 245 is coupled to the AC power supply 113 via the AC power supply transmission line 119.

The ceramic ring 250 is disposed on the electrostatic chuck 215 (e.g., on the first material 236, or the heater electrode) and surrounds the radially outward edge of the second material 240. The ceramic ring 250 may be made of, for example, alumina or aluminum nitride, and may have a thickness within a range of about 1 millimeter to about 20 millimeters. One or more O-rings 221 can be provided between the ceramic ring 250 and the second material 240 to protect any bonding material otherwise exposed therebetween.

The ring electrode 111 can be a component of the ceramic ring 250 or a separate component. For example, in the illustrated embodiment, the ring electrode 111 is embedded in the ceramic ring 250. The ring electrode 111 may be positioned about 0.3 millimeters to about 1 millimeter from the upper surface of the ceramic ring 250, such as about 0.75 millimeters. The ring electrode 111 may have a width of about 3 millimeters to about 20 millimeters, such as about 15 millimeters.

The ring electrode 111 is positioned radially outward of the perimeter of the substrate 105 and beneath the edge ring 106. In one example, the ring electrode 111 may have an inner diameter greater than 200 millimeters, or greater than 300 millimeters, or greater than 450 millimeters. The ring electrode 111 is electrically coupled to ground and/or matching network 112 through the edge tuning circuit 155 which can include one or more capacitors and/or inductors. The ring electrode 111 may be coupled to the edge tuning circuit 155 through multiple transmission lines 265 (two are shown). For example, the ring electrode 111 may be coupled to the edge tuning circuit 155 through three transmission lines 265 spaced about the substrate support assembly 104 at even intervals (e.g., 120 degrees).

Figure 3:
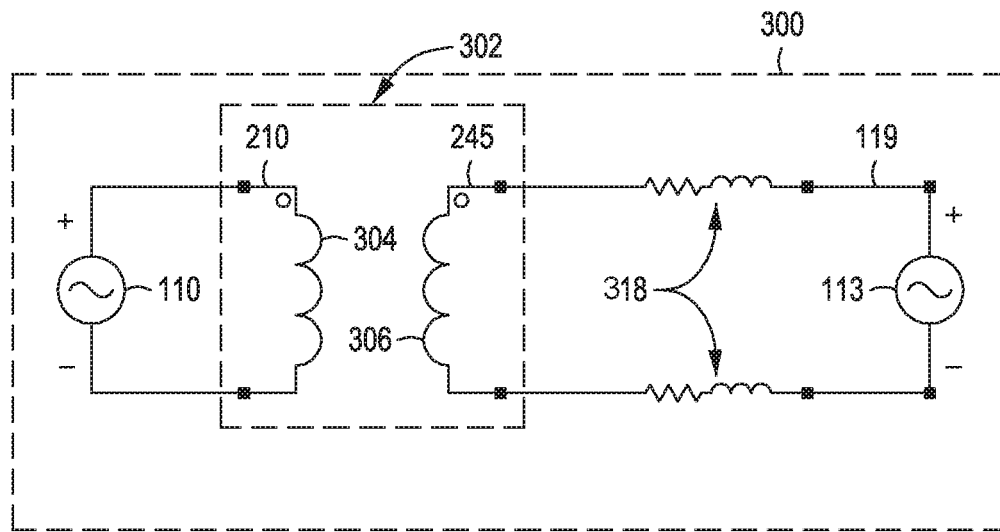
FIG. 3 is a diagram of an equivalent lump circuit model illustrating RF coupling between an RF electrode and an embedded resistive heater of the substrate support of FIG. 2 in accordance with at least some embodiments of the present disclosure.
Figure 4:
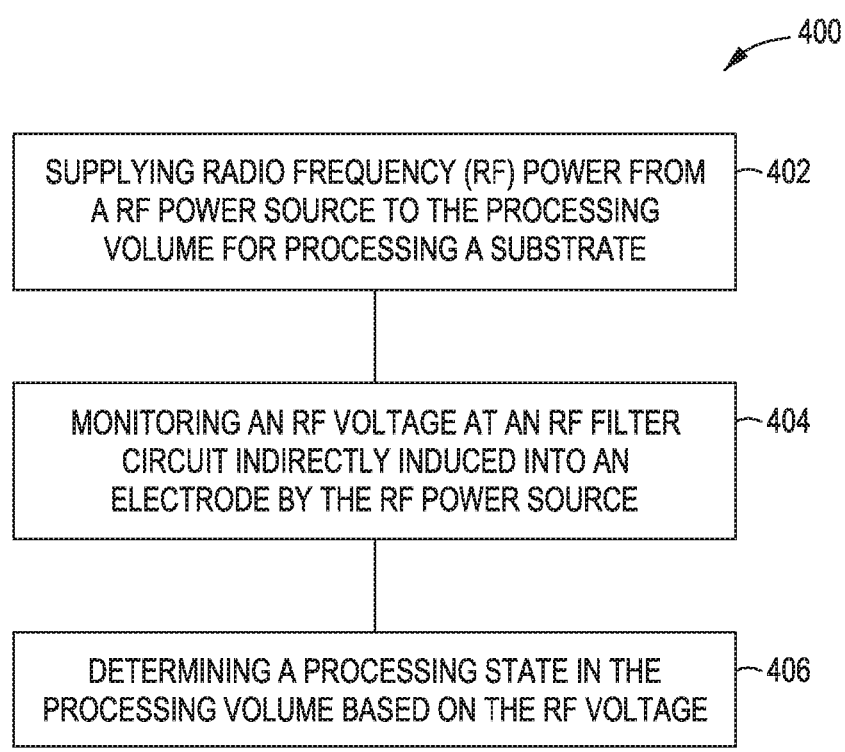
FIG. 4 is a method of monitoring a processing condition in a processing volume of a processing chamber in accordance with at least some embodiments of the present disclosure.

FIG. 3 is a diagram of an equivalent lump circuit model 300 illustrating RF coupling between an RF electrode (e.g., the electrode 210) and an embedded resistive heater (e.g., the electrode 245) of the substrate support assembly 104 of FIG. 2 in accordance with at least some embodiments of the present disclosure. FIG. 4 is a method 400 of monitoring a processing condition in a processing volume of a processing chamber in accordance with at least some embodiments of the present disclosure.

The inventors have found that since the electrode 245 is embedded in the ceramic layer 246 the electrode 210 and the electrode 245 can be represented as transformer 302. For example, the electrode 210 can be represented as a first winding 304 of a transformer 302 and the electrode 245 can be represented as a secondary winding 306 of the transformer 302. The RF energy supplied by the RF power source 110 to the electrode 210 is RF coupled to the electrode 245. The RF energy coupled to the electrode 245 travels along the AC power supply transmission line 119 and a portion thereof decays (e.g., is attenuated) due to the resistance and inductance associated with the AC power supply transmission line 119, which can be represented by the inductor and resistor combination 318, shown on both an input and an output of the AC power supply 113.

At 402, radio frequency (RF) power from a RF power source is supplied to the processing volume for processing a substrate. For example, the RF power source 110 can be used to provide RF energy to the electrode 210. The RF energy provided to the electrode 210 can be used to heat, for example, the substrate 105 supported on the substrate support assembly 104. Some of the RF energy is indirectly induced (RF coupled) into the electrode 245 and travels along the AC power supply transmission line 119.

At 404, the induced RF voltage from the electrode 245 is monitored (e.g., measured) at the capacitive coupling port 123 of the RF filter circuit 115. For example, the RF voltage, which is an attenuated portion of the RF voltage induced into the electrode 245, e.g., due to decay along the AC power supply transmission line 119, can be measured by the controller 108. For example, the controller 108 can use one or more devices suitable for monitoring the coupled RF voltage. For example, in at least some embodiments, an oscilloscope, spectrum analyzer, or the like can be used to monitor/measure the coupled RF voltage at the capacitive coupling port 123. In at least some embodiments, monitoring the RF voltage includes monitoring an RF voltage peak-to-peak ($V_{pp}$). The controller 108 can be configured to monitor the RF $V_{pp}$ according to one or more control schemes. For example, the controller 108 can be configured to monitor the RF $V_{pp}$ continuously or periodically (e.g., over a certain time frame). For example, in at least some embodiments, the controller 108 can be configured to monitor the RF $V_{pp}$ at the capacitive coupling port 123 continuously as a substrate is being plasma processed (e.g., in real time).

At 406, a processing state in the processing volume can be determined based on the monitored RF voltage. For example, the controller 108 is configured to compare the measured/monitored RF voltage with previously measured/monitored RF voltages stored in, for example, the memory 142. Based on the measured/monitored RF voltage, the controller 108 can determine a processing state, e.g., a state of the plasma 116 in the processing volume of the processing chamber 100. For example, a sudden change in $V_{pp}$ of a measured/monitored RF voltage can be indicative of an unstable or stable plasma condition.

Additionally, to prevent damage to the AC power supply 113 and/or the AC power supply transmission line 119, which can be caused by relatively high RF current associated with the RF voltage, the combination inductor and capacitor 117 can be used to pass only relatively low RF (e.g., about 60 Hz to about 100 Hz).

While the foregoing is directed to embodiments of the present disclosure, other and further embodiments of the disclosure may be devised without departing from the basic scope thereof.

The invention claimed is:

1. A processing chamber for processing a substrate, comprising:
    a chamber body defining a processing volume;
    a radio frequency (RF) power source configured to deliver RF energy to the processing volume for processing a substrate;
    the substrate support comprising an electrode;
    an AC power supply configured to supply power to the processing chamber;
    an RF filter circuit connected between the electrode and the AC power supply; and
    a controller configured to monitor an RF voltage at the RF filter circuit that is indirectly induced into the electrode by the RF power source during operation, and to determine a processing state in the processing volume based on the monitored RF voltage,
    wherein the RF filter circuit is connected to an AC power supply transmission line of the AC power supply and comprises:
    a capacitive coupling port coupled to the controller and configured to provide a measurement of the RF voltage to the controller; and
    an inductor and capacitor connected in series and configured as low pass frequency filter.

2. The processing chamber of claim 1, wherein the capacitive coupling port is configured to provide a capacitive coupling power of about −40 dB to about −47 dB.

3. The processing chamber of claim 1, wherein a monitored RF voltage is voltage peak-to-peak.

4. The processing chamber of claim 1, wherein a monitored RF voltage is an attenuated portion of the RF voltage induced into the electrode.

5. The processing chamber of claim 1, wherein the processing state in the processing volume comprises a state of a plasma in the processing volume.

6. The processing chamber of claim 1, wherein the electrode is a resistive heater having a plurality of resistive heating elements embedded in a ceramic layer of the substrate support.

7. A method of monitoring a processing condition in a processing volume of a processing chamber, comprising:
    supplying radio frequency (RF) power from a RF power source to the processing volume for processing a substrate;
    monitoring an RF voltage at an RF filter circuit indirectly induced into an electrode by the RF power source; and
    determining a processing state in the processing volume based on the RF voltage,
    wherein the RF filter circuit is connected to an AC power supply transmission line of an AC power supply configured to supply power to the processing chamber and comprises:
    a capacitive coupling port coupled to a controller of the processing chamber and configured to provide a measurement of the RF voltage to the controller; and
    an inductor and capacitor connected in series and configured as low pass frequency filter.

8. The method of claim 7, wherein the capacitive coupling port is configured to provide a capacitive coupling power of about −40 dB to about −47 dB.

9. The method of claim 7, wherein monitoring the RF voltage comprises monitoring an RF voltage peak-to-peak.

10. The method of claim 7, wherein the RF voltage at the RF filter circuit is an attenuated portion of the RF voltage induced into the electrode.

11. The method of claim 7, wherein the processing state in the processing volume comprises a state of a plasma in the processing volume.

12. The method of claim 7, wherein the electrode is a resistive heater having a plurality of resistive heating elements embedded in a ceramic layer of a substrate support of the processing chamber.

13. A non-transitory computer readable storage medium having stored thereon instructions that when executed by a processor perform a method of monitoring a processing condition in a processing volume of a processing chamber, the method comprising:

supplying radio frequency (RF) power from a RF power source to the processing volume for processing a substrate;

monitoring an RF voltage at an RF filter circuit indirectly induced into an electrode by the RF power source; and determining a processing state in the processing volume based on the RF voltage, wherein the RF filter circuit is connected to an AC power supply transmission line of an AC power supply configured to supply power to the processing chamber and comprises:

a capacitive coupling port coupled to a controller of the processing chamber and configured to provide a measurement of the RF voltage to the controller; and an inductor and capacitor connected in series and configured as low pass frequency filter.

14. The non-transitory computer readable storage medium of claim 13, wherein the capacitive coupling port is configured to provide a capacitive coupling power of about −40 dB to about −47 dB.

15. The non-transitory computer readable storage medium of claim 13, wherein monitoring the RF voltage comprises monitoring an RF voltage peak-to-peak.

16. The non-transitory computer readable storage medium of claim 13, wherein the RF voltage at the RF filter circuit is an attenuated portion of the RF voltage induced into the electrode.

17. The non-transitory computer readable storage medium of claim 13, wherein the processing state in the processing volume comprises a state of a plasma in the processing volume.

* * * * *